(12) United States Patent
Liehr

(10) Patent No.: US 6,191,532 B1
(45) Date of Patent: Feb. 20, 2001

(54) ARRANGEMENT FOR PRODUCING PLASMA

(75) Inventor: Michael Liehr, Feldatal (DE)

(73) Assignee: Leybold Systems GmbH, Hanau (DE)

(*) Notice: Under 35 U.S.C. 154(b), the term of this patent shall be extended for 0 days.

(21) Appl. No.: 09/317,992

(22) Filed: May 25, 1999

(30) Foreign Application Priority Data

May 29, 1998 (DE) .............................. 198 24 077

(51) Int. Cl.$^7$ .............................. H01J 7/24; H05B 31/26
(52) U.S. Cl. .............................. 315/111.21; 118/723 AN; 118/723 I
(58) Field of Search .................. 315/111.21, 111.51; 118/723 I, 723 IR, 723 AN, 723 MW

(56) References Cited

U.S. PATENT DOCUMENTS 4,297,615 * 10/1981 Goebel et al. .................. 315/111.21

FOREIGN PATENT DOCUMENTS

| 41 36 297 | 5/1993 | (DE). |
| 43 37 119 | 5/1995 | (DE). |
| 195 03 205 | 7/1996 | (DE). |

* cited by examiner

Primary Examiner—Michael B Shingleton
(74) Attorney, Agent, or Firm—Smith, Gambrell & Russell, LLP

(57) ABSTRACT

For an arrangement for producing plasma in a vacuum chamber (3) with the aid of electromagnetic alternating fields, a rod-shaped conductor (4) is guided though a vacuum chamber (3) within a tube (5) of insulating material, with the inner diameter of the insulating tube (5) being greater than the diameter of the conductor (4) and at least one end of the insulating tube (5) being held in a wall (6,7) of the vacuum chamber (3) and the outer surface of the insulating tube being sealed with respect to the vacuum chamber, with at least one end of the conductor (4) being connected to a first source (8,9) for producing electromagnetic alternating fields and the region of the section of the rod-shaped conductor (4) which extends into the vacuum chamber (3) being in the form of a helix (2), with the winding length (L) of said section amounting to $L=C/\cos(\alpha)$ for a wavelength $\lambda_0 = 10° < \alpha < 15°$.

4 Claims, 4 Drawing Sheets

Key: 1   Substratum $C = \pi \times D$

L

Plasma

Key: 1    Substratum

Key: 1    Substratum

ARRANGEMENT FOR PRODUCING PLASMA

INTRODUCTION AND BACKGROUND

The present invention relates to an arrangement for producing plasma in a vacuum chamber with the aid of electromagnetic alternating fields, with at least one rod-shaped conductor projecting into a vacuum chamber within a tube of insulating material and the inner diameter of the insulating tube being greater than the diameter of the conductor, with at least one end of the insulating tube being held in a wall of the vacuum chamber and the outer surface of the insulating tube being sealed with respect to the vacuum chamber and at least one end of the conductor being connected to a source for producing electromagnetic alternating fields.

A known arrangement for producing plasma (DE 19,503, 205) enables plasma to be produced, in a limited operating range (processing range, gas pressure, microwave capacity), as a surface treatment and coating technique. The known arrangement consists, in essence, of a cylindrical glass tube installed in a vacuum processing chamber and, having located therein, a metallic conductive tube, with atmospheric pressure prevailing in the interior space of the glass tube.

Microwave capacity is introduced at both sides through the walls of the vacuum process chamber by means of two infeeds and two metallic coaxial lines, consisting of an inner line and an outer line. Within the vacuum processing chamber, the absent outer line of the coaxial line is replaced by means of a plasma discharge, which, with sufficient conditions for ignition (gas pressure), the microwave capacity ignites and maintains, with microwave capacity being able to escape from the two metallic coaxial lines and through the glass tube into the vacuum processing chamber.

Plasma surrounds the outside of the cylindrical glass tube and, together with the inner line, forms a coaxial line having a very pronounced vaporization cover. With a fixed microwave capacity fed from both sides, the gas pressure of the vacuum processing chamber may be adjusted such that there is an evident and uniform burning of plasma along the device wherever, within the vacuum processing chamber, the outer line of the coaxial cable is absent.

In addition, an arrangement is known for the local production of a plasma in a treatment chamber, by means of microwave activation (DE 4,136,297), which chamber, by means of a flange which may be built into a wall, or by means of the wall itself, is divided into an outer and an inner part, with a device for producing microwaves being arranged at the outer part. The microwaves of which device are guided to the inner part by means of a microwave coupling device, with the microwave coupling device featuring an outer control hollow conduit, of an insulating material, which passes through the flange. Inside the outer control hollow conduit is a metal inner conduit, with microwaves from the microwave producing device being coupled in the inner conduit.

Finally, an arrangement for producing plasma in a vacuum chamber with the aid of electromagnetic alternating fields has been proposed (DE 19,722,272.2), for which a rod-shaped conductor is guided through a vacuum chamber within a tube of an insulating material and the inner diameter of the insulating tube is greater than the diameter of the conductor, with both ends of the insulating tube being held in walls of the vacuum chamber. The outer surface of the insulating tube is sealed with respect to the walls and both ends of the conductor are connected, in each case, to a first source for producing electromagnetic alternating fields. The rod-shaped conductor is surrounded, in each case, in the regions of both wall leadthroughs, in the direction of its more centered section, by a tubular piece of an electrically conductive material, with there being an amount of clearance, with the two tubular pieces being arranged concentrically to the insulating tube. In each case, the circular cylindrical intermediate spaces formed by the insulating tube and respective tubular piece are connected to a second source for producing an electromagnetic alternating field.

An object of the present invention is to create an arrangement of the type described above, which is suitable for avoiding fluctuation in the deposited coating which has its basis in the emergence of threshold fields in the microwaves.

A further object of the present invention is to avoid the the installation of costly disposable lines in order to protect the microwave transmitters from reflective capacity.

A further object of the present invention is to form antennas such that they possess, in addition to the inherent radiation characteristics of each antenna, the additional property of being able to emit high-frequency waves, without again picking up the reflected capacity as a result of using the apparatus (e.g., from the plasma).

SUMMARY OF THE INVENTION

The above and other objects of the invention can be achieved in accordance with the invention by means of the fact that the region of the section of the rod-shaped conductor which extends into the vacuum chamber is in the form of a helix, with the length of the turns of said section approximately corresponding to a wavelength $\lambda$ for a pitch angle of $10° < \alpha < 15°$.

In a preferred embodiment, rod-shaped conductors are guided through the vacuum chamber within a tube of insulating material, with the inner diameter of the insulating tube being greater than the diameter of the conductor and both ends of the insulating tube being held in walls of the vacuum chamber. The outer surface of the insulating tube is sealed with respect to the walls and the conductors are connected, in each case, to a separate source for producing electromagnetic alternating fields. The regions of the sections of the rod-shaped conductors which extend into the vacuum chamber are in the form of a helix and the lengths of the turns of said two sections approximately corresponding to a wave length $\lambda$ and an angle of $10° < \alpha < 15°$.

In an alternate embodiment, rod-shaped conductors are guided through a vacuum chamber within tubes of insulating material, with the inner diameter of the insulating tubes, in each case, being greater than the diameter of the conductor. Each end respectively of the insulating tubes are held in the walls of the vacuum chamber and, in each case, the outer surface of the insulating tubes are sealed with respect to the walls. One end of each conductor, in each case, is connected to a source for producing electromagnetic alternating fields, with the regions of the sections of the rod-shaped conductors which extend into the vacuum chamber being in the form of helices and the lengths of the turns of said two sections approximately corresponding to a wave length $\lambda$ and a pitch angle of $10° < \alpha < 15°$.

BRIEF DESCRIPTION OF DRAWINGS

The invention permits the widest variety of embodiment possibilities; three of these are represented, purely in schematic form, in the accompanying drawings, wherein.

DETAILED DESCRIPTION OF INVENTION

The present invention will now be described in further detail.

Figure 1:
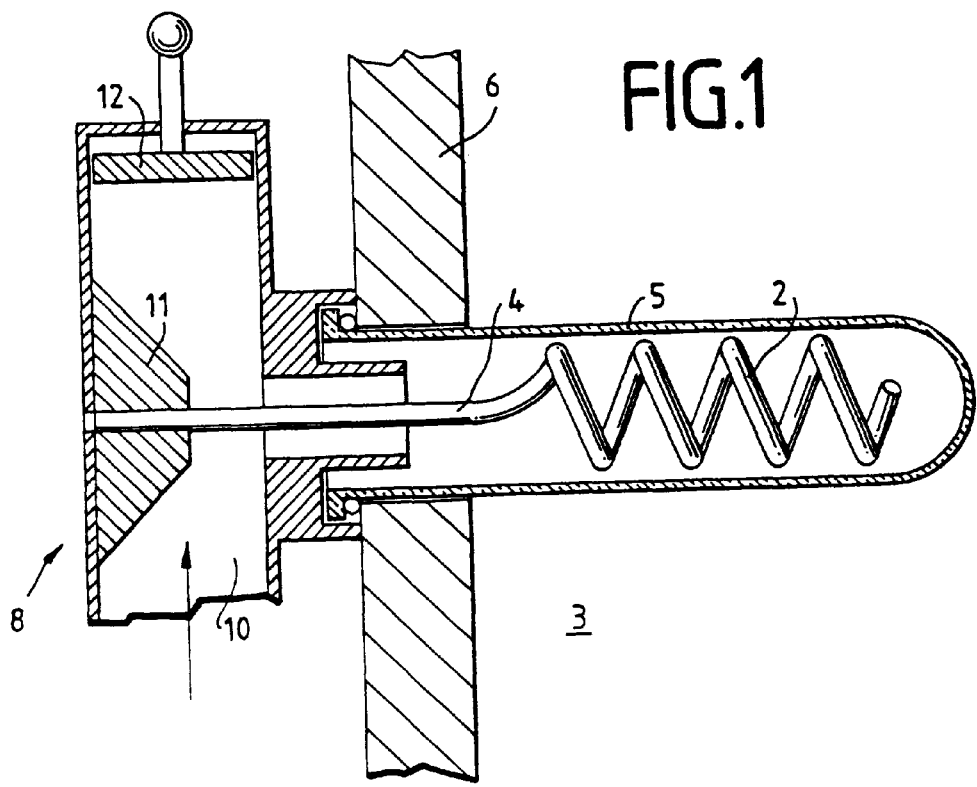
FIG. 1 is a partial sectional view of a section through an arrangement having a helix and an insulating tube which is closed on the side of the vacuum chamber in accordance with the invention.

The arrangement represented in FIG. 1 relates to a helical antenna which is operated in $T_1$ mode, with circular polarized microwave radiation along the center axis being emitted from the free end of the helix and igniting and maintaining a plasma discharge.

Microwave capacity, from a microwave generator, is supplied by means of a rectangular waveguide tube (10), which, by means of impedance adapters (11,12), is transferred to a coaxial line (4). The helix of the antenna (2) is connected to the inner conductor of the coaxial line (4) and converts transverse electromagnetic waves of the coaxial line into circular polarized waves and emits the same through a vacuum-tight, but microwave-permeable tube (5) into the vacuum chamber (3). Tube 5 can be made of glass. The metallic conductive wall (6) of the vacuum chamber (3) serves, in this connection, as a reflector shield for backward waves.

Figure 4:
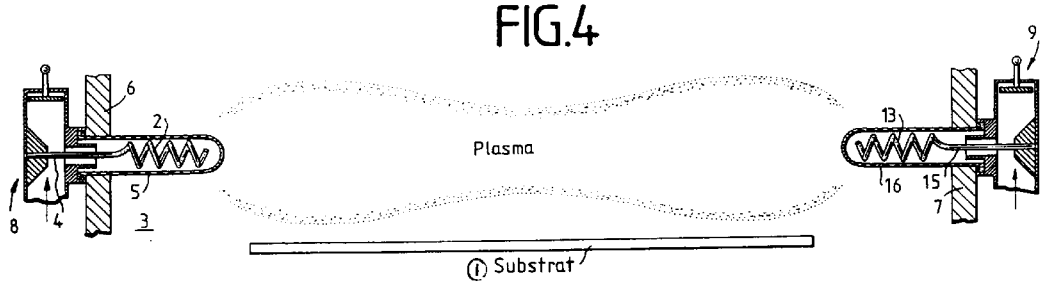
FIG. 4, is a schematic representation of the plasma cloud for an embodiment having two helices arranged opposite each other in, in each case, a closed insulating tube.

Several arrangements of the type described may emit microwave capacity in one and the same plasma treatment chamber (FIG. 4), with individual antennas being decoupled in terms of microwave technology, provided that arrangements located opposite each other have opposed winding directions (helicity).

Stated more precisely: If the arrangement on one side possesses right-handed helicity, the other arrangement must have left-handed helicity. Under ideal conditions, left-handed polarized microwave radiation cannot be absorbed by a right-handed helical antenna (coil antenna) and vice versa. Circular polarized microwave radiation changes its respective polarizing direction when reflected on a metallic conductive planar surface.

Figure 5:
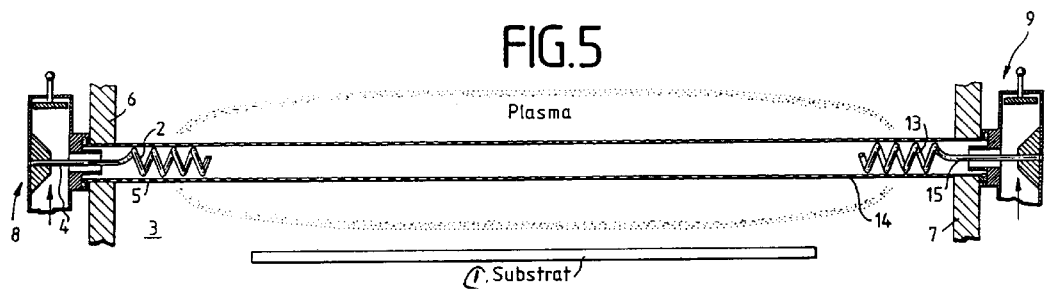
FIG. 5, is a schematic representation of a plasma cloud for an arrangement similar to that of FIG. 4, but having a common insulating tube which encircles both helices.

Each two opposing arrangements in accordance with the invention may be arranged in a common, vacuum-tight and microwave-permeable tube, as shown in FIG. 5, with the two arrangements being of opposite helicity.

The microwave capacity emitted in a forward direction from arrangements in accordance with the invention produces plasma discharges, which, for microwave radiation, from a wave-mechanical point of view, represents an absorbing dielectric in which microwaves undergo severe vaporization. In order to attenuate the vaporization and, consequently, to change the geometric shape of the plasma (especially: to extend in a longitudinal direction), it may be advantageous to create a plasma-free connecting channel between the two arrangements. With a corresponding selection of the operating parameters, a closed plasma column which is largely free of standing wave field patterns may be produced between, in each case, two opposing arrangements in accordance with the invention.

Figure 2:
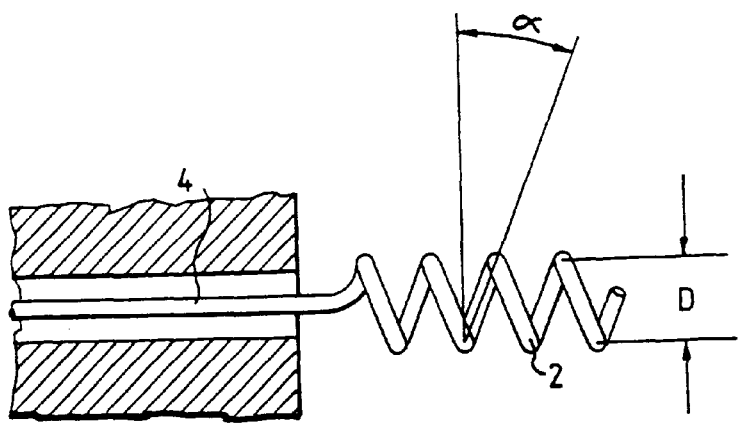
FIG. 2, is a partial sectional view of a separate representation of a typical helix.
Figure 2A:
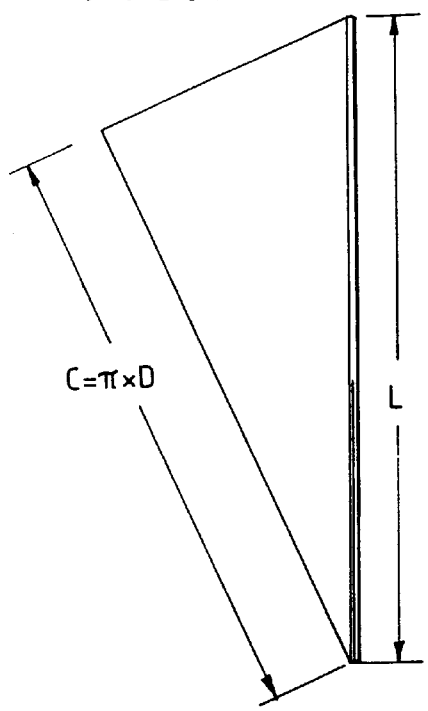
FIG. 2a, is a schematic view of the layout of a helix.
Figure 3:
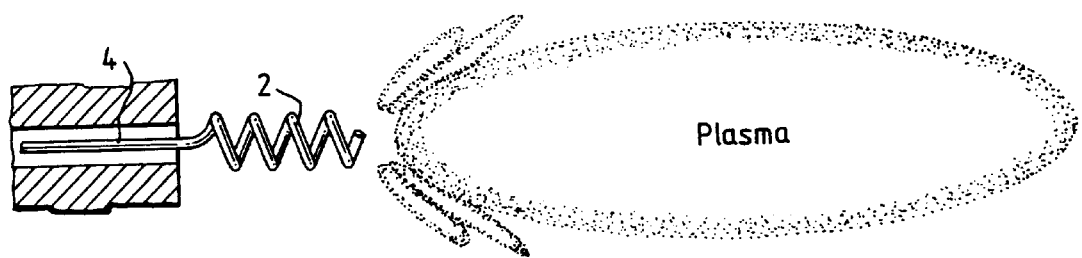
FIG. 3, is a schematic representation of a plasma cloud during operation of the arrangement of FIG. 1 in $T_1$ mode.
Figure 3A:
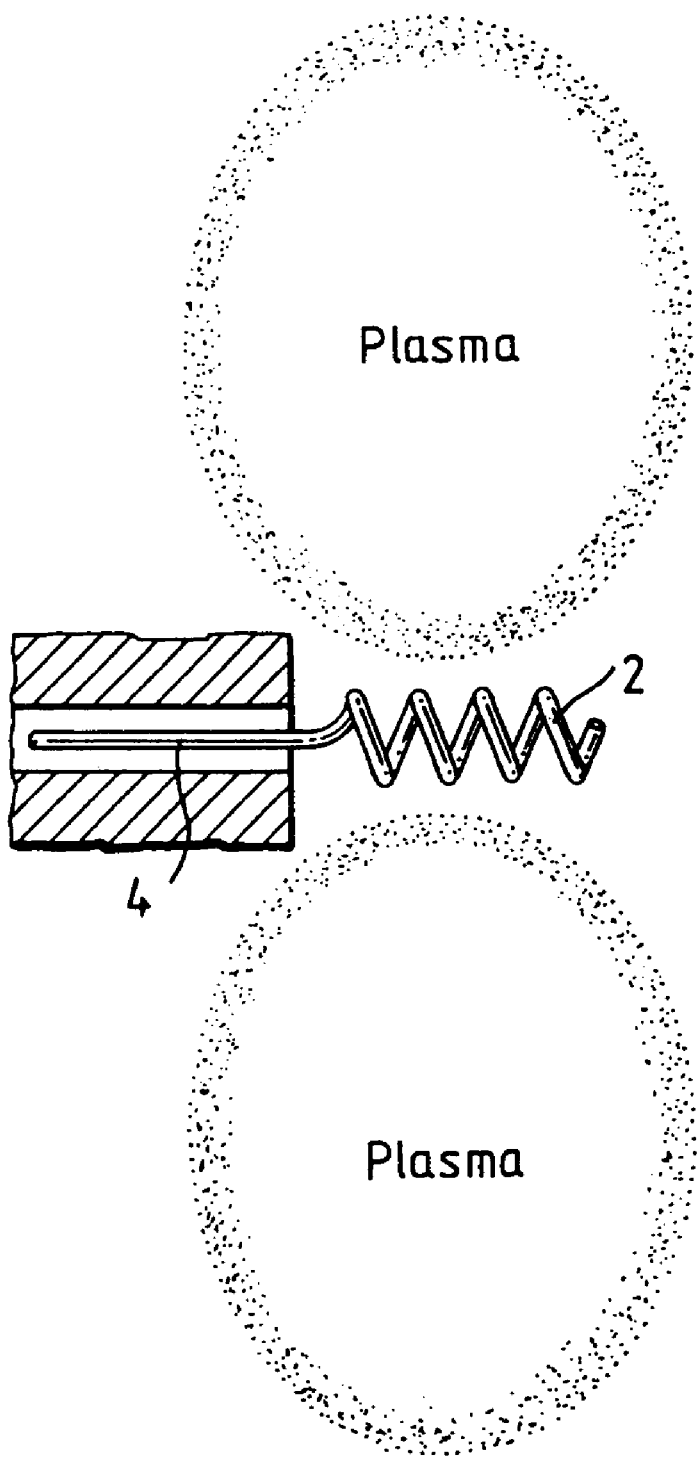
FIG. 3a, is a schematic representation of a plasma cloud during operation of the arrangement of FIG. 1 in $T_0$ mode.

The helically shaped rod antenna (also identified as a helix) used to emit microwaves is provided such that it is operated in the so-called $T_1$ mode. FIG. 2 shows a helical antenna having approximately 4 turns, which are provided with microwave capacity by means of a coaxial line. The radiation characteristics of a helix are a function, first, of the ratio of the winding diameter (D) to the wavelength ($\lambda_0$) of the applied microwaves and, second, of the winding pitch angle ($\alpha$). According to the selection of these parameters, a helical antenna emits waves, in an extreme case, in two different modes, which largely show complementary radiation characteristics, as indicated in FIG. 3. $T_1$ mode:

Winding length $L=C/\cos(\alpha)$ corresponds approximately to wavelength $\lambda_0$ and $10°<\alpha<15°$.

In this operating state, a helical antenna radiates from the free end of the helix (endfire) with a strongly distinctive primary maximum and small secondary lobes, concentric to the center line of the helix. In addition to this, the radiation for a helical antenna having at least 4 turns possesses a largely circular polarization, the direction of rotation of which is established by the helicity of the antenna. A helical antenna of this type is identified as a Kraus Coil (monofil, axial mode $T_1R_1$). More on this may be found in Antennas, $2^{nd}$ Edition, John D. Kraus, McGraw-Hill Book Company, Chapter 7. The possible antenna yield is a function of the geometry of the helix, such as the diameter of the windings, pitch angle of the windings, and overall length and may amount to up to 15 dB. In this connection, however, it is almost independent of the diameter of the tubular, metallic conductive material and also of its specific electric resistance (compare D. T. Emerson, National Radio Astronomy Observatory, Antenna Compendium Volume 4, pp 64–68, 1995, published by AARL).

$T_0$ mode:

Length of winding $L=C/\cos(\alpha)$ is substantially smaller than wavelength $\lambda_0$ and $10°<\alpha<15°$.

In this operating state, the helix radiates with an intensity distribution, the maximum of which is almost perpendicular to the center axis of the helix, hence, radial, similar to a straight rod antenna. This operating state is the basis for the arrangement in accordance with Offenlegungsschrift DE 4,136,297 or Patentschrift DE 19,503,205. $T_0$ mode is of no interest for the object of the invention.

$T_2, T_3, \ldots$ mode:

Winding length $L=C/\cos(\alpha)$ is substantially greater than wavelength $\lambda_0$ and $10°<\alpha<15°$.

Further variations and modifications of the foregoing will be apparent to those skilled in the art and are intended to be encompassed by the claims appended hereto.

German priority application 198 24 077.5 is relied on and incorporated herein by reference.

I claim:

1. An arrangement for producing plasma in a vacuum chamber with the aid of electromagnetic alternating fields, comprising a rod-shaped conductor for guiding through a wall of a vacuum chamber, a tube of insulating material for housing said conductor, the inner diameter of the insulating tube being greater than the diameter of the conductor, with at least one end of the insulating tube being holdable in a wall of a vacuum chamber and the outer surface of the insulating tube being sealable with respect to a vacuum chamber and at least one end of the conductor being connectable to a first source for producing electromagnetic alternating fields, with a region of a section of the rod-shaped conductor which is extendable into a vacuum chamber being in the form of a helix, with the winding length (L) of said section amounting to $L=C/\cos(\alpha)$ for a wavelength $\lambda_0=10°<\alpha<15°$.

2. An arrangement for producing plasma in a vacuum chamber with the aid of electromagnetic alternating fields, comprising a plurality of rod-shaped conductors being guidable through a wall of a vacuum chamber, said conductors being within a tube of insulating material having ends and the inner diameter of the insulating tube being greater than the diameter of the conductors, with both ends of the insulating tube being holdable in walls of a vacuum chamber and the outer surfaces of the insulating tube being sealable with respect to walls of a vacuum chamber and the conductors are connectable to a separate source for producing electromagnetic alternating fields, with regions of the sections of the rod-shaped conductors extendable into a vacuum chamber being in the form of helices and the length of the turns (L,L') of said two sections amounting to $L=C/\cos(\alpha)$ for a wavelength $\lambda_0=10°<\alpha<15°$.

3. An arrangement for producing plasma in a vacuum chamber with the aid of electromagnetic alternating fields, comprising a plurality of rod-shaped conductors are guidable through a vacuum chamber, said conductors located within tubes of insulating material and the inner diameter of the insulating tube, in each case, being greater than the diameter of the conductor, with, in each case, one end of an insulating tube being holdable in walls of a vacuum chamber and, in each case, the outer surface of an insulating tube being sealable with respect to walls of a vacuum chamber and, in each case, one end of each conductor being connectable to a source for producing electromagnetic alternating fields, with the regions of the sections of the rod-shaped conductors which are extendable into a vacuum chamber being in the form of helices and the length of the turns (L,L') of said two sections corresponding to $L=C/\cos(\alpha)$ approximately of a wavelength $\lambda_0=10°<\alpha<15°$.

4. A vacuum chamber fitted with the arrangement according to claim 1.

* * * * *